United States Patent [19]

Heep

[11] Patent Number: 5,194,978

[45] Date of Patent: Mar. 16, 1993

[54] TIMER SYSTEM FOR LEARNING AND REPLAYING OF INFRARED SIGNALS

[75] Inventor: Jerry J. Heep, Weatherford, Tex.

[73] Assignee: Tandy Corporation, Fort Worth, Tex.

[21] Appl. No.: 793,973

[22] Filed: Nov. 18, 1991

Related U.S. Application Data

[62] Division of Ser. No. 377,966, Jul. 11, 1989.

[51] Int. Cl.$^5$ ............................................. H04B 10/00
[52] U.S. Cl. ............................... 359/148; 340/825.72; 358/194.1
[58] Field of Search ............... 359/142, 146, 148, 143, 359/152, 154; 455/142, 352, 353, 354, 355; 375/82, 88; 340/825.54, 825.69, 825.72, 825.63, 825.64, 825.22; 358/194.1

[56] References Cited

U.S. PATENT DOCUMENTS

| | | | |
|---|---|---|---|
| 4,623,887 | 11/1986 | Welles II | 359/143 |
| 4,626,848 | 12/1986 | Ehlers | 359/143 |
| 4,905,279 | 2/1990 | Nishio | 340/825.69 |

Primary Examiner—Edward L. Coles, Sr.
Assistant Examiner—R. Bacares
Attorney, Agent, or Firm—Townsend & Townsend

[57] ABSTRACT

A remote controller capable of learning and later transmitting infrared signals transmitted by any other remote controller. The remote controller determines which of four modes of transmission a signal is transmitted in, including carrier mode, pulse mode, frequency shift keying mode and continuous wave mode. Once the type of signal is determined the controller learns each signal, saves them and later replays them to control a remote device.

16 Claims, 7 Drawing Sheets

TIMER SYSTEM FOR LEARNING AND REPLAYING OF INFRARED SIGNALS this is a division of application Ser. No. 07/377,966, filed Jul. 11, 1989.

BACKGROUND OF THE INVENTION

The present invention relates generally to learning and replaying of infrared signals in a system with a remote controller and a controlled device. More particularly, the invention is directed to learning the signals of any standard, preset remote controller or controllers and replaying them to control the remote device or devices.

Remote controlled devices have become quite popular in recent years. A typical consumer may purchase a wide assortment of remote controlled devices including, but not limited to, televisions, video cassette recorders, and stereo systems. Each of these devices comes with its own, separate remote control. The consumer must keep a multiplicity of controllers readily at hand in order to enjoy the use of the purchased devices. As the number of remote controlled devices increases, the number of remote controllers becomes more and more of a nuisance.

Presently, universal remote controllers are available. These controllers will learn and later replay infrared patterns to control a group of remote devices. A problem that exists in the available universal remote controllers is that the timer hardware systems, built into the existing microprocessors used in these universal remote controllers, are too limited to perform universal remote control functions.

SUMMARY OF THE INVENTION

The present invention provides a single remote controller capable of learning and replaying the infrared signals of any other controller. This invention may be substituted for a multiplicity of controllers allowing a person to use each of the remote controlled devices with a single remote controller.

Another object of the invention is to provide a single remote controller which can learn and replay infrared signals encoded in any of four transmission modes including carrier mode, pulse mode, frequency shift keying mode, or continuous wave mode.

A further object of the invention is to provide a single remote controller which can be reprogrammed upon the purchase of new remote controlled devices. The capability of reprogramming allows the user to continue to use one remote controller even after the purchase of additional remote controlled devices.

Another object of the invention is to provide a custom timer for interacting with a microprocessor unit to control remote devices. The custom timer is designed to overcome the limitations inherent in the timer hardware built into the presently existing universal remote controllers. This custom timer makes the universal remote control functions easier to implement and increases the efficiency of the remote controller.

These features, as well as others, will become more readily apparent from the following detailed description of the preferred embodiment when taken in conjunction with the illustrative embodiment in the accompanying drawings.

BRIEF DESCRIPTION OF THE DRAWINGS

FIG. 4 is a flow chart illustrating how the timer circuit of FIG. 2 determines what mode the carrier signal is being transmitted in;

DETAILED DESCRIPTION OF THE PREFERRED EMBODIMENT

Figure 1:
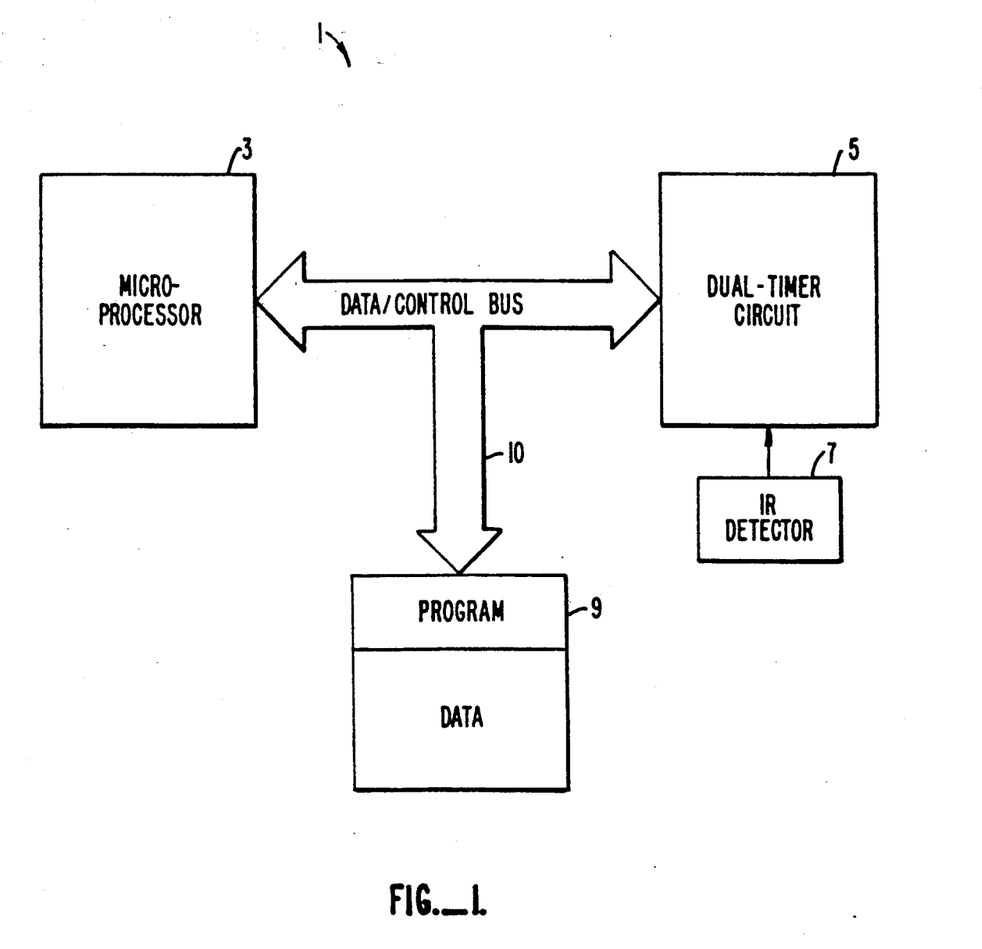
FIG. 1 is a block diagram of the system including the custom timer circuit.

FIG. 1 is a functional block diagram of a system 1 which is used to learn save, and replay infrared patterns. System 1 includes a microprocessor 3 for controlling operations. A dual-timer circuit 5 is used to capture and replay the timing of the signals received from an infrared detector 7. A memory 9 stores the programs to be executed by the microprocessor 3 and data captured by times circuit 5. Finally, a data/control line 10 connects microprocessor 3, timer circuit 5 and memory 9.

Figure 2:
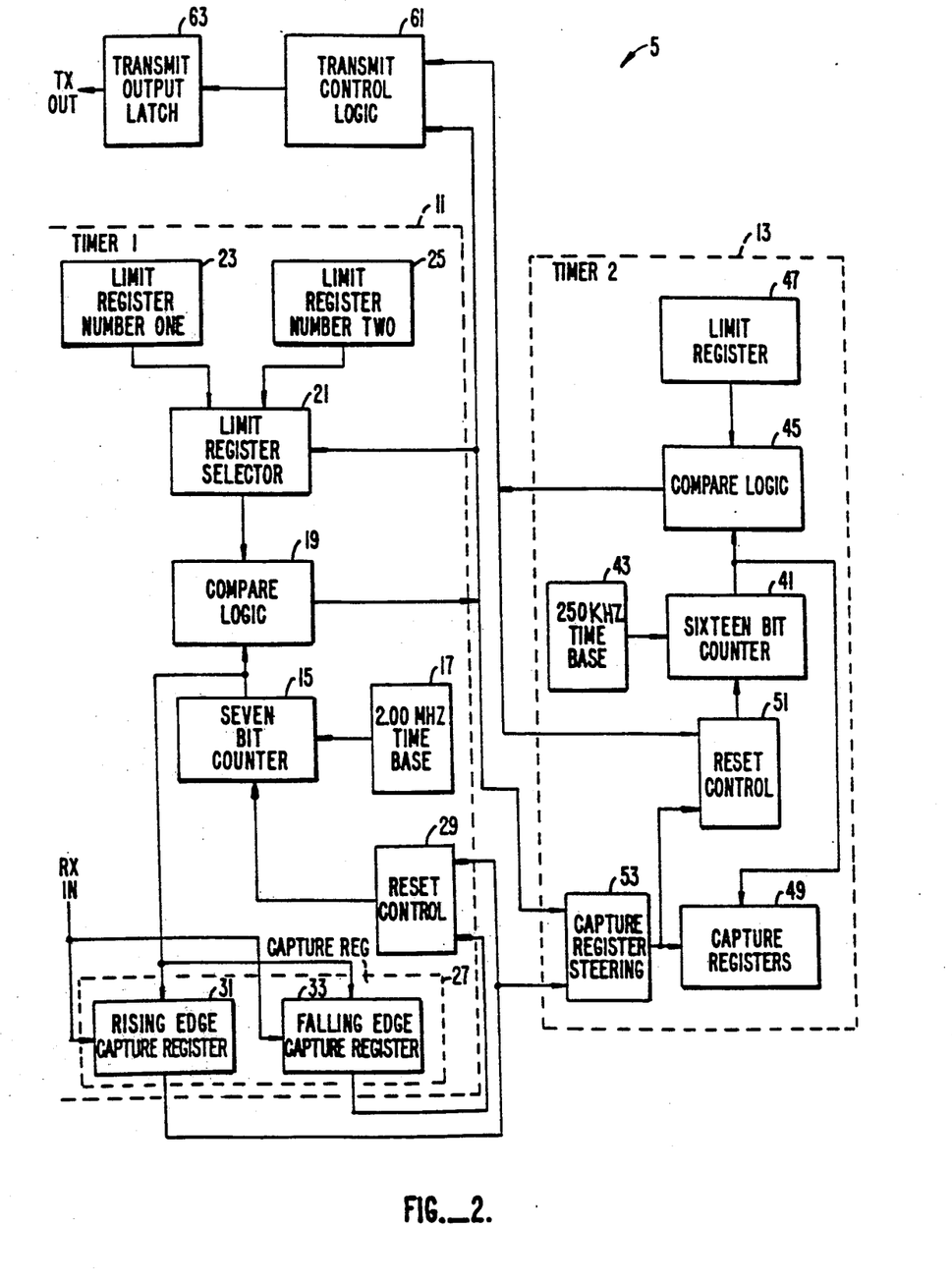
FIG. 2 is a block diagram of the custom timer circuit.

FIG. 2 is a functional block diagram of the preferred embodiment of dual timer circuit 5 shown in FIG. 1. A first timer 11 operates in conjunction with a second timer 13 to learn and replay infrared signals received from an infrared detector.

First timer 11 includes a counter 15 which is driven by a clock 17. Counter 15 is connected to a compare logic unit 19. Compare logic unit 19 compares the count value of counter 15 to the value output by limit register selector 21. Limit register selector 21 selects between the outputs of limit register one 23 and limit register two 25. Of course, more than two limit registers may be used and in some cases, only one is necessary.

In addition to being connected to compare logic unit 19, counter 15 is connected to capture register unit 27. The outputs of capture register unit 27 are input to a reset control unit 29 which resets counter 15.

Capture register unit 27 includes a rising edge capture register 31 and a falling edge capture register 33. These registers are used to capture the edges of the signal received on the "RX IN" line from the infrared detector (not shown). In addition, these registers capture the time period of the pulse width from counter 15.

First timer 11 interacts with second timer 13. Second timer 13 includes similar components to those of first timer 11. A counter 41 is driven by a clock 43. The output of counter 41 is fed to a compare logic unit 45. Compare logic unit 45 is connected between counter 41 and a limit register 47. Count values from counter 41 and limit register 47 are compared and the output of compare logic unit 45 is dependent upon which value is greater. The output of counter 41 is also input to capture registers 49. A reset control unit 51 is connected to reset counter 41 and compare logic unit 45. Upon receipt of a signal from either compare logic unit 45 or a capture register steering unit 53, reset control unit 51 resets counter 41.

Capture register steering unit 53 transmits signals to capture registers 49 upon receipt of signals from either rising edge capture register 31 or compare logic unit 19.

Finally, a transmit control logic unit 61 receives an input from each of compare logic units 19 and 45. The output is directed to a transmit output latch 63 where it is output from the remote controller.

FIG. 3 is a set of four timing diagrams showing the four, different infrared signals. FIG. 3A shows carrier mode. Carrier mode is made up of "burst packets" of pulses contained in burst packet time 79. These burst packets are interspersed with idle times 81. The remote controller transmits varying burst packet time periods 79 and idle time periods 81 which represent a variety of commands.

Figure 3A:
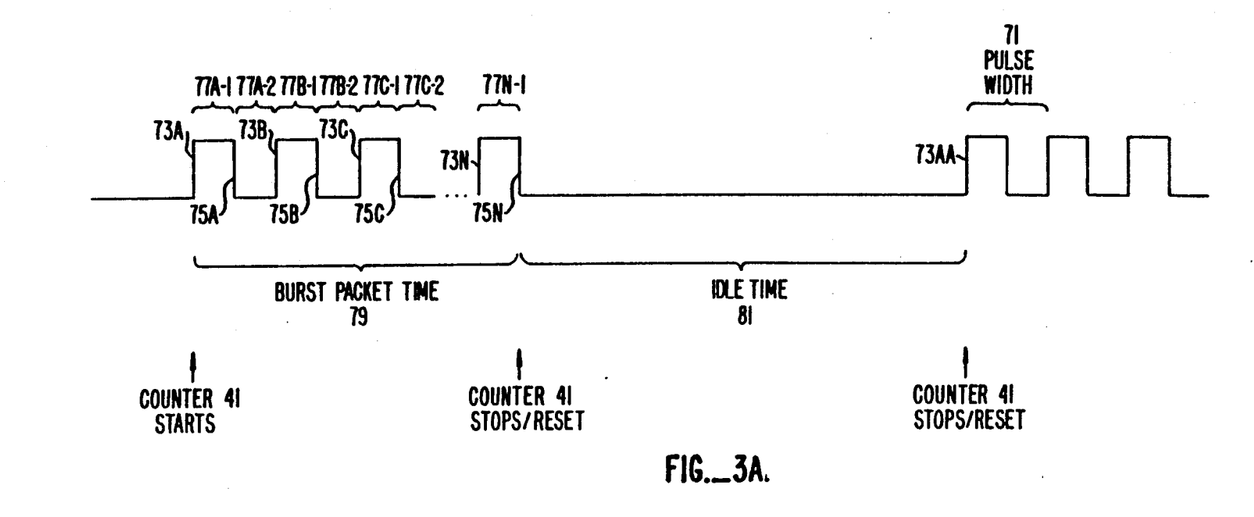
FIGS. 3a-3d are timing diagram illustrating the various encoded infrared signals.
Figure 3B:
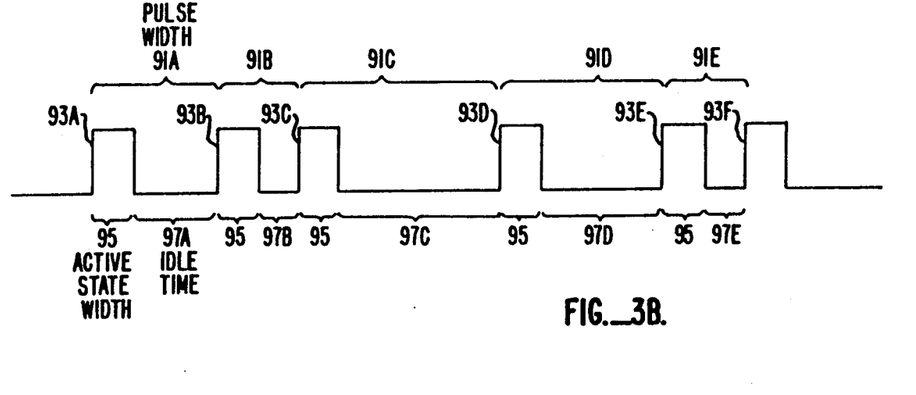

FIG. 3B shows pulse mode. Pulse mode is made up of pulses of equal active state width 95 interspersed with idle times 97. The varying idle time periods between pulses allow a variety of commands to be represented.

Figure 3C:
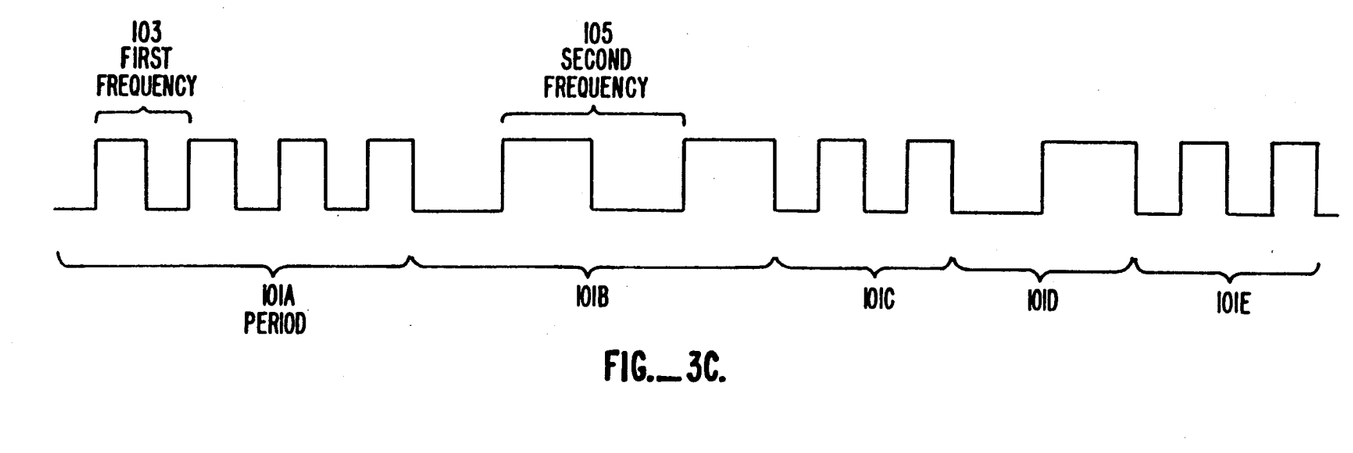

FIG. 3C shows frequency shift keying mode. Frequency shift keying mode is made up of a continuous train of pulses which switch between two different frequencies. For example, period 101A contains a group of pulses having a first frequency 103 while period 101B contains a group of pulses having a second frequency 105. The pattern of frequency changes determines the information that is transmitted to the receiving device.

Figure 3D:
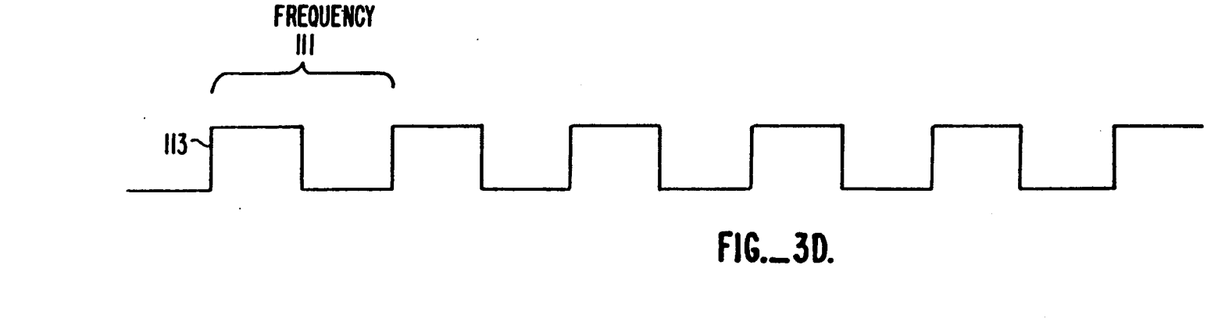

Finally, FIG. 3D shows continuous wave mode. A continuous wave mode signal is made up of a continuous train of a constant frequency 111. By varying frequency 111, a variety of commands are transmitted.

FIGS. 3A-3D will be more fully explained along with the operation of the various functions of the invention. Those functions include the learn function and the transmission function.

Figure 4:
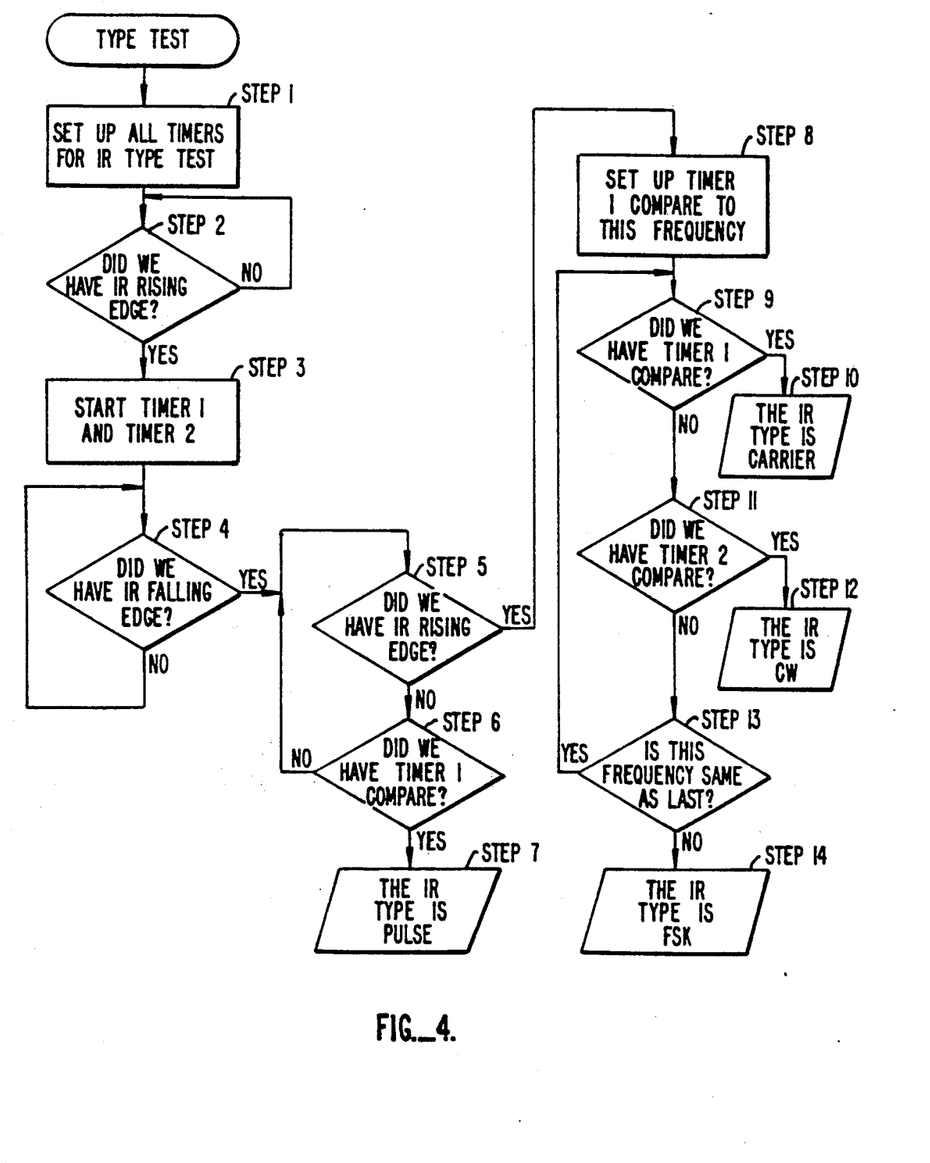
Figure 5:
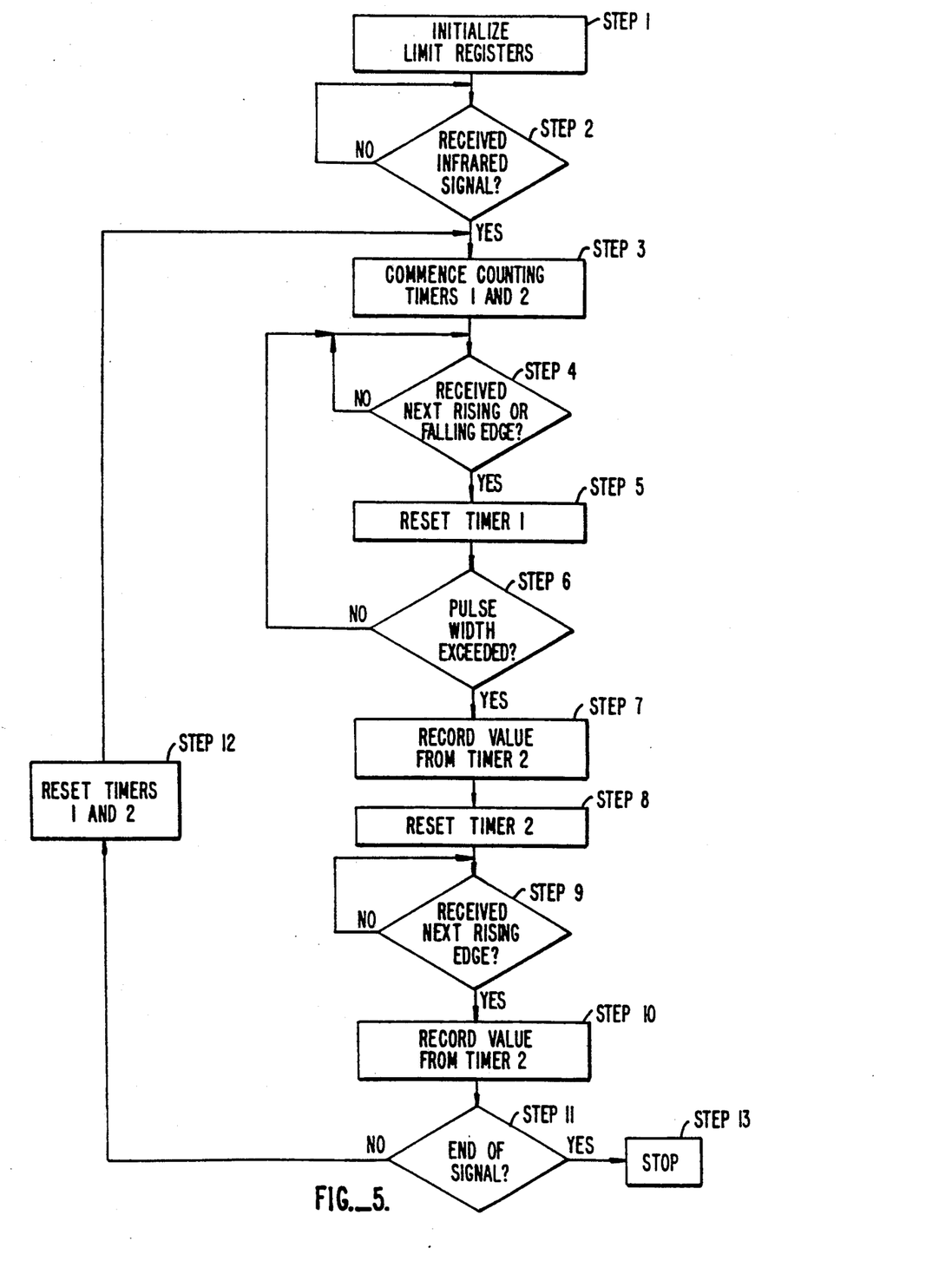
FIG. 5 is a flow chart illustrating the carrier mode learn function
Figure 6:
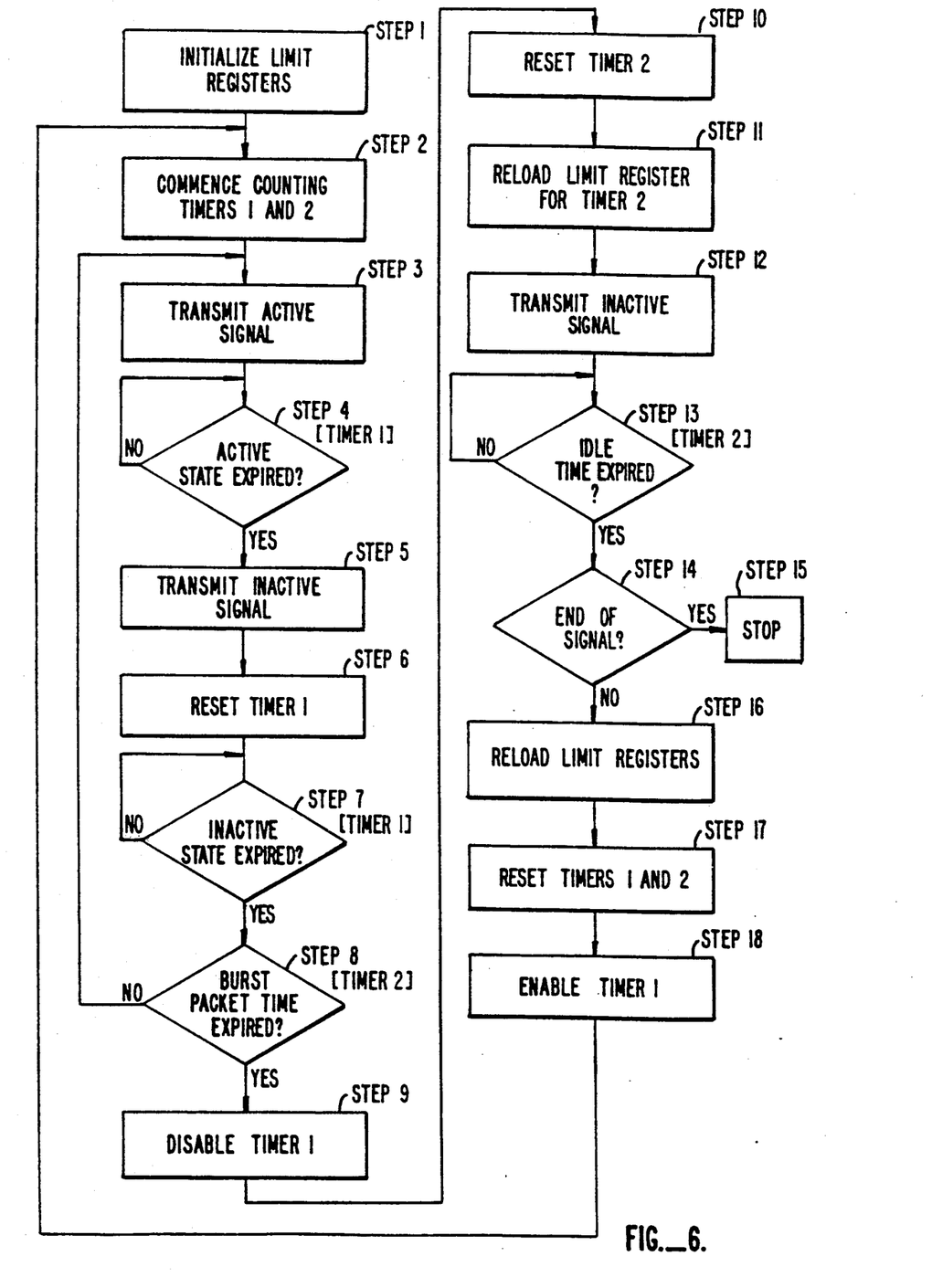
FIG. 6 is a flow chart illustrating the carrier mode transmit function.

FIGS. 4, 5, and 6 are flow charts which illustrate various functions of the invention. These figures will be more fully explained below as the functions are described.

The learn function involves receiving a set of infrared signals from a preset remote control device and saving them to be replayed later. The transmission function involves recalling the saved infrared signals and replaying them to control a remote device.

The operation of the invention will now be discussed with reference to FIGS. 1, 2, 3, and 4.

Infrared Signal Mode Determination

Before the remote controller can learn the various commands of another preset controller, it must determine which of the four modes is being received on the RX IN line. FIG. 4 illustrates how this determination is made. Initially, the remote controller presumes that the incoming infrared signal will be encoded in the carrier mode. This is because carrier mode is the most commonly used mode.

Microprocessor 3 under control of a type determination program stored in memory 9 sets up the timers for determination of the mode of the incoming signals (step 1). Limit register one 23 is loaded with a preselected value equal to the lowest possible carrier mode pulse width 71. First timer 11 then waits for a rising edge (step 2). When a rising edge is received, both counters 15, 41 are started (step 3). A falling edge is eventually received (step 4), at which time a rising edge is anticipated (step 5). If first counter 15 is not reset fast enough by a second rising edge (step 5), then it is determined whether or not a compare took place in first timer 11 (step 6). If a compare occurred (step 6), then the signal is a pulse mode signal (step 7). Otherwise, the system waits for the next rising edge (step 5). Pulse mode is known and selected in the case that a compare occurs because the time between pulse mode pulses is greater than the value in limit register one 23.

If a rising edge does occur fast enough (step 5), counter 15 is reset and first timer 11 is set up to compare frequency (step 8). If a compare occurs (step 9) and the count of first counter 15 does not exceed the value in limit register one 23, then it is known the incoming signal is carrier mode (step 10). Otherwise, the signal is continuous wave or frequency shift key mode.

In deciding between continuous wave and frequency shift key modes, second counter 41 is checked for a reset signal. If counter 41 is reset (step 11), the signal is a continuous wave signal (step 12). Otherwise the frequency of the present pulse is checked to see if it is the same as the last pulse (step 13). If it is not the same, the signal is in frequency shift key mode (step 14). If it is the same, the system is sent back to check whether a compare has occurred in first counter 15 (step 9).

Learn Function

Once the mode of the signal is determined, the remote controller can actually learn the signal. Of course, this procedure starts as soon as a signal is received. Therefore, the timers 11, 13 must be keeping track of the elapsed periods even before a determination of the mode is made.

Since carrier mode is the most popular mode of transmission, this description will be limited to carrier mode operation. Differences in operation for the other three modes will be pointed out as necessary. Carrier mode learn will be described with reference to FIGS. 1, 2, 3, and 5.

The description of the carrier mode learn function will be made with reference to FIG. 5. Initially, limit register one 23 is loaded with a preselected count value, selected by microprocessor 3 equal to a period of a "false" infrared carrier mode signal frequency (Step 1). It is "false" because it is a carrier mode signal frequency which is not possible. Limit register selector 21 is locked to receive an input from limit register one 23. As an infrared signal is received (Step 2) on the RX IN line, counters 15, 41 begin counting (Step 3). Every time a rising edge 73 or falling edge 75 of the infrared signal is received by rising edge capture register 31 and falling edge capture register 33 respectively (Step 4), a signal is transmitted to reset control unit 29. This signal causes the value in counter 15, which is equal to the width of the pulse 77 of the infrared signal, to be stored in capture register unit 27. The active state width 77A-1 between rising edge 73 and falling edge 75 is captured by rising edge capture register 31 while the inactive state width 77A-2 between falling edge 75 and rising edge 73 is captured by falling edge capture register 33. At the same time, reset control unit 29 resets counter 15 (Step 5). Active state widths 77A-1 and inaction state widths 77A-2 are stored by microprocessor 3 in memory 9.

Each time the count value in counter 15 is increased, compare logic unit 19 compares the new count value to the preselected count value stored in limit register one 23 (Step 6). Providing the count of counter 15 has not exceeded the preselected count value, counters 15, 41 continue to count. If the count value has exceeded the preselected count value a number of simultaneous events are caused to occur. First, compare logic unit 19 issues a signal to capture register steering unit 53. Second, capture register steering unit 53 triggers burst packet time 79, which is equal to the count value from counter 41, to be stored in capture register 49 (Step 7).

Burst packet time is also stored by microprocessor 3 in memory 9. Third, capture register steering unit 53 causes reset control unit 51 to reset counter 41 (Step 8). And fourth, capture register steering logic unit 53 is set to receive a capture trigger from rising edge capture register unit 31.

After being reset, counter 41 begins counting again. The value of the count in counter 41 now begins keeping track of the idle time 81 between burst packet times 79 of carrier mode data. This idle time 81 is critical for reproducing the infrared signal. Counter 41 stops counting upon receipt of the next rising edge 73AA. When idle time 81 has expired, next rising edge 73AA (Step 9) of the IR burst will trigger second timer 13 to capture idle time 81 and set capture register steering unit 53 back to monitor compare logic unit 19 of first timer 11. This is accomplished by counter 41 storing its count in capture register 49 upon receiving a reset signal from reset control unit 51. The idle time value is also stored in memory 9 by microprocessor 3 (Step 10). Providing the end of the signal has not been indicated (Step 11), the reset control unit 51 receives the reset signal from capture register steering unit 53 when the next rising edge 73AA from rising edge capture register 31 is received (Step 12). If the end of the signal has been reached, system 1 stops (Step 13).

In pulse mode, rising edge capture data is ignored. The pulse width 91 is measured by the data inside falling edge capture register 33. Capture register steering unit 53 is locked to only sample pulses from rising edge capture register 31. In this manner, rising edges 93 are used to signal the end of the idle times 97 between pulses and to restart counter 41 for the beginning of the next measurement cycle. Limit registers 23 and 25 are not used in the pulse mode.

Frequency shift key mode requires heavy microprocessor interaction. First timer 11 is set up to measure period 101 and not pulse widths. In this mode, the rising edge capture register 31 is used to reset counter 15 while falling edge capture register 33 captures data. The capture of data does not affect the count of counter 15. Second timer 13 is set up to be triggered by the microprocessor, not any first timer 11 source.

Continuous wave mode is the least complex. First timer 11 measures frequency 111 of the infrared signal. Second timer 13 is unused. When the continuous carrier is terminated, compare logic unit 45 will detect that counter 15 has exceeded the value in limit register one 23.

Transmission Function

Transmission does not require the use of capture registers 27 and 49. However, limit registers 23, 25, and 47 are essential. As with the description of the learn mode, transmission mode will be described with respect to carrier mode transmission. This description will follow the steps of FIG. 6. Differences for the other three modes will be pointed out as necessary.

In carrier mode, microprocessor 3 sets the limit registers of first timer 11 to hold active state width 77A-1 and inactive state width 77A-2 of burst packet time 79. Limit register one 23 holds active state width 77A-1 while limit register two 25 holds inactive state width 77A-2. Limit register 47 of second timer 13 alternatively holds burst packet time 79 and idle time 81 of the infrared signal (Step 1).

First counter 15 and second counter 41 are signalled by microprocessor 3 to begin counting (Step 2). Transmit output latch unit 63 is set to transmit an active signal. The output of first counter 15 is continually compared to limit register one 23 (Step 4). When the count in first counter 15 exceeds the active state width time 77A-1 held in limit register one 23, transmit output latch 63 is switched to transmit an inactive signal (Step 5).

Once transmit output latch 63 is set to transmit an inactive signal, two events are caused to occur. First, limit register selector 29 is set to output the inactive state width time 77A-2 held in limit register two 25. And second, counter 15 is reset to begin counting again (Step 6).

The inactive state continues until first counter 11 exceeds the inactive state width 77A-2 stored in limit register two 25 (Step 7). Compare logic unit 19 compares the count value to the inactive state width 77A-2 after each increment of first counter 15. Then, when compare logic unit 19 detects that the count value has exceeded the inactive state width 77A-2, transmit output latch 63 is again switched to the active state.

Transmit output latch 63 continues to switch back and forth between active and inactive. This switching allows for the transmission of the burst packets of the carrier mode infrared signal. The switching between active and inactive continues until second counter 41 reaches burst packet time 79 held in limit register 47 (Step 8). This burst packet time 79 is detected by compare logic unit 45 which compares burst packet time 79 to the count value of second counter 41 after each time counter 41 is incremented.

Once burst packet time 79 is reached, compare logic unit 45 will issue a signal causing a number of events to occur. First, transmit output latch 63 is disabled and reset to its inactive state. Second, limit compares from first timer 11 are prevented from affecting the output latch, essentially disabling first timer 11 (Step 9). Third, counter 41 is reset to begin counting again (Step 10). And fourth, the microprocessor 3 is signalled that a new time limit needs to be loaded into limit register 47 equal to idle time 81 (Step 11). Once idle time 81 has been loaded into limit register 47, second counter 41 counts until the inactive state (Step 12) has been transmitted for idle time 81 (Step 13).

When idle time 81 has been reached, compare logic unit 45 will signal that idle time 81 is complete and another burst packet can be transmitted. If the end of the signal is indicated (Step 14), system 1 stops (Step 15). Otherwise, the limit registers are reloaded (Step 16), the timers are reset (Step 17). Output latch 63 is switched to the active state and first timer 11 is enabled (Step 18), permitting it to frequency modulate the diodes as described above. The above described sequence is then repeated.

Pulse mode infrared transmission is accomplished with less microprocessor interaction. The reason for this is that a single constant active state width 95 is transmitted in pulse mode. The microprocessor loads limit register one 23 with the required active state width 95 and limit register 47 with idle time 97A. Once the limit registers are loaded, the microprocessor starts both counters 15, 41. When first counter 15 reaches active state width 95 held in limit register 23, transmit output latch 63 is switched to be inactive. At the same time, first timer 11 is disabled from signalling transmit output latch 63.

Transmit output latch 63 stays inactive until second counter 41 reaches idle time 97A stored in limit register 47. At that point a number of events occur. First, first timer 11 is re-enabled. Second, the microprocessor loads limit register 47 with the next idle time 97B. Third, both counters 15, 41 are cleared and restarted.

Frequency shift keying mode requires heavy microprocessor interaction. First frequency period 101A is loaded into limit register one 23 and limit register 25. The active time is held in limit register 23 while the inactive time is held in limit register two 25. The time that first frequency 103 is present is loaded into limit register 47. Compare logic unit 45 is disconnected from transmit control logic unit 61 so that when a limit compare occurs, the infrared wave train is not interrupted. Both counters 15, 41 are then started.

The actual infrared output operates similarly to carrier mode transmission except that second timer 13 cannot turn off the transmit carrier. Instead, when second timer 13 compares a limit value to the count value in counter 41, second counter 13 is reset and the microprocessor is signalled to load a new limit value into limit register 47. The microprocessor must supply the longer second timer limit value as well as the switch frequency. Therefore, the microprocessor must supply both limit registers 23, 25 in first timer 11 with new period information and supply the limit to the length of time the next frequency is output.

The final transmission mode is continuous wave mode. This mode is quite simple. The microprocessor merely has to set up first timer 11 for constant carrier output and turn off second timer 13. The microprocessor supplies the same frequency for as long as the user holds down a key.

The invention as described provides a remote controller which can be programmed and reprogrammed to replace a multiplicity of preprogrammed remote controllers. The invention accomplishes remote control of a multiplicity of devices through the use of a custom designed timer circuit. This timer circuit solves the problems associated with the limited features of prior "built in" microprocessor timers. Further, the timer circuit can be used in any of four transmission modes including carrier mode, pulse mode, frequency shift keying mode, and continuous wave mode.

In general, to those skilled in the art to which this invention relates, many changes in construction and widely differing embodiments and applications of the present invention will suggest themselves without departing from its spirit and scope. Thus, the disclosures and descriptions herein are purely illustrative and are not intended to be in any sense limiting.

What is claimed is:

1. A method for determining the mode of transmission of an infrared signal composed of a series of pulses of varying widths interspersed between idle periods of varying widths, each pulse including an initial portion, an active state, and a passive state, the method comprising the steps of:
   (a) commencing measurement of the period of a received pulse signal upon receipt of an initial portion;
   (b) comparing the measured value from step (a) with a first limit value;
   (c) identifying the mode as the pulse mode if the measured value matches the limit value before receipt of the next initial portion;
   if the measured value does not match the limit value before receipt of the next initial portion, continuing the method by:
   (d) commencing measurement of ht period of the next pulse signal upon receipt of the next initial portion;
   (e) comparing the measured value form step (d) with a second limit value;
   (f) identifying the mode as the carrier mode if the measured value in step (d) matches the limit value before receipt of the next succeeding initial portion,
   if the measured value in step (d) does not match the second limit value before receipt of the next succeeding initial portion, continuing the method by:
   (g) comparing the total elapsed time since receipt of the initial portion in step (a) with a third limit value;
   (h) identifying the mode as the continuous wave (CW) mode if the elapsed time matches the third limit value;
   if the elapsed time does not match the third limit value, continuing the method by:
   (i) determining the period of the last received complete pulse signal;
   (j) comparing the period determined in step (i) with a fourth limit value;
   (k) identifying the mode as the frequency shift key (FSK) mode when the period differs from the fourth limit value by a predetermined amount; and
   f the period determined in step (i) does not differ form the fourth limit value by a predetermined amount, continuing the method by returning to step (d) and repeating steps (d) through (k) until one of the three modes is identified.

2. The method of claim 1 wherein said first limit value is related to the minimum expected pulse frequency of the received signal.

3. The method of claim 2 wherein said first limit value is the period of a signal having a frequency substantially equal to the value of the minimum expected pulse frequency of the received signal.

4. The method of claim 1 wherein said second limit value is related to the duration of the first received pulse.

5. The method of claim 4 wherein said second limit value is the period of a signal having a frequency less than the frequency of the first received pulse.

6. The method of claim 1 wherein said third limit value is a value greater than the expected duration of a carrier mode burst packet.

7. The method of claim 1 wherein said fourth limit value is equal to said second limit value.

8. A method for determining the mode of transmission of a infrared signal composed of a series of pulses of varying widths interspersed between idle periods of varying widths, each pulse including an initial portion, a active state, and a passive state, the method comprising the steps of:
   (a) commencing measurement of the period of a received pulse signal upon receipt of an initial portion;
   (b) comparing the measured value from step (a) with a first limit value related to the minimum expected pulse frequency of the receive signal;
   (c) identifying the mode as the pulse mode if the measured value matches the limit vale before receipt of the next initial portion;
   if the measured value does not match the limit value before receipt of the next initial portion, continuing the method by:

(d) commencing the measurement of the period of the next pulse signal upon receipt of the next initial portion;

(e) comparing the measured value form step (d) with a second limit value; and (f) identifying the mode as the carrier mode if the measured value in step (d) matches the limit value before receipt of the next succeeding initial portion.

9. The method of claim 8 wherein said first limit value is the period of a signal having frequency substantially equal to the value of the minimum expected pulse frequency of the received signal.

10. A method for determining the mode of transmission of an infrared signal composed of a series of pulses of varying widths interspersed between idle periods of varying widths, each pulse including an initial portion, an active state, and a passive state, the method comprising the steps of:

(a) commencing measurement of the period of a received pulse signal upon receipt of an initial portion;

(b) comparing the measured value form step (a) with a first limit value;

(c) identifying the mode as the pulse mode if the measured value matches the limit vale before receipt of the next initial portion;

if the measured value does not match the limit value before receipt of the next initial portion, continuing the method by:

(d) commencing measurement of the period of the next pulse signal upon receipt of the next initial portion;

(e) comparing the measured value from step (d) with a second limit value related to the duration of the first received pulse; and (f) identifying the mode as the carrier mode if the measured value in step (d) matches the limit value before receipt of the next succeeding initial portion.

11. The method of claim 10 wherein said second limit value is the period of a signal having a frequency less than the frequency of the first received pulse.

12. A method of determining the mode of transmission of an infrared signal composed of a series of pulses of varying widths interspersed between idle periods of varying widths, each pulse including an initial portion, an active state, and a passive state the method comprising the steps of:

(a) commencing measurement of the period of a received pulse signal upon receipt of an initial; portion;

(b) comparing the measured value from step (a) with a first limit value;

(c) identifying the mode as the pulse mode if the measured value matches the limit value before receipt of the next initial portion;

if the measured value does not match the limit value before receipt of then ext initial portion, continuing the method by:

(d) comparing the total elapsed time since receipt of the initial portion in step (a) with a second limit value;

(e) identifying the mode as the continuous wave (CW) mode if the elapsed time matches the second limit value;

if the elapsed time does not match the second limit value, continuing the method by:

(f) determining the period of the last received complete pulse signal;

(g) comparing the period determined in step (e) with a third limit value; and (h) identifying the mode as the frequency shift key (FSK) mode when the period differs form the third limit value by a predetermined amount.

13. The method of claim 12 wherein, if the period determined in step (h) does not differ form the third limit value by a predetermined amount, continuing the method by returning the step (d) and repeating steps (d) through (h) until one of the CW and FSK modes is identified.

14. The method of claim 12 wherein said third limit value is related to the duration of the complete received pulse signal.

15. The method of claim 12 wherein said third limit value is the period of a signal having a frequency substantially equal to the frequency of the first complete received pulse signal.

16. A method for determining the mode of transmission of an infrared signal composed of a series of pulses of varying widths interspersed between idle periods of varying widths, each pulse including a rising edge, an active state, and a falling edge, the method comprising the steps of:

a. initiating a first counter and a second counter to begin counting upon receipt of a first rising edge;

b. waiting a first predetermined time period;

c. comparing a first count value in said first counter to a preselected limit value to determine whether the pulse width exceeds a predetermined length:

d. setting the mode to be pulse mode if said first count value exceeds said preselected limit value:

e. resetting said first counter upon receipt of a next rising edge;

f. waiting a second predetermined time period;

g. comparing a second count value in said first counter to said first count value;

h. setting the mode to be frequency shift key mode if said second count value is substantially different from said first count value;

i. waiting a third predetermined time period:

j. comparing a third count value in said second counter to a predetermined continuous wave limit value:

k. setting the mode to be continuous wave mode if said third count value exceeds said predetermined continuous wave limit value; and l. setting the mode to be carrier wave mode if said third count value does not exceed said predetermined continuous wave limit value.

* * * * *